(12) United States Patent
Stapelbroek

(10) Patent No.: US 6,236,508 B1
(45) Date of Patent: May 22, 2001

(54) MULTICOLOR DETECTOR AND FOCAL PLANE ARRAY USING DIFFRACTIVE LENSES

(75) Inventor: Maryn G. Stapelbroek, Santa Ana, CA (US)

(73) Assignee: The Boeing Company, Seal Beach, CA (US)

( * ) Notice: Subject to any disclaimer, the term of this patent is extended or adjusted under 35 U.S.C. 154(b) by 0 days.

(21) Appl. No.: 09/262,143

(22) Filed: Mar. 3, 1999

(51) Int. Cl.[7] .................................................. G02B 27/44
(52) U.S. Cl. ........................ 359/565; 359/615; 359/900; 250/338.4; 250/339.01; 250/339.02; 250/370.13; 250/216
(58) Field of Search .................................... 257/294, 188; 250/216, 338.4, 339.01, 339.02, 224, 338.1, 339.05, 370.08, 370.12, 370.13, 370.14; 359/565, 615, 356, 566, 900, 569

(56) References Cited

U.S. PATENT DOCUMENTS

| | | | |
|---|---|---|---|
| 2,755,401 | * 7/1956 | Tirico | 250/216 |
| 3,107,302 | 10/1963 | Coleman | 250/214.1 |
| 3,957,354 | 5/1976 | Knop | 359/568 |
| 3,962,577 | 6/1976 | Lindley et al. | 250/208.2 |
| 4,062,628 | 12/1977 | Gale | 359/568 |
| 4,082,438 | 4/1978 | Knop | 353/97 |
| 4,130,347 | 12/1978 | Knop | 359/568 |
| 4,506,949 | 3/1985 | Knop | 359/568 |
| 4,939,369 | * 7/1990 | Elabd | 250/338.4 |
| 4,956,686 | 9/1990 | Borrello et al. | 257/440 |
| 5,010,381 | * 4/1991 | Shiba | 357/30 |
| 5,239,179 | * 8/1993 | Baker | 250/338.4 |
| 5,373,182 | * 12/1994 | Norton | 257/440 |
| 5,444,236 | * 8/1995 | Ludington et al. | 250/226 |
| 5,479,258 | * 12/1995 | Hinnrichs et al. | 356/326 |
| 5,497,269 | 3/1996 | Gal | 359/615 |
| 5,525,801 | 6/1996 | Jacksen et al. | 250/352 |
| 5,550,373 | 8/1996 | Cole et al. | 250/338.1 |
| 5,559,336 | * 9/1996 | Kosai et al. | 250/338.4 |
| 5,600,486 | 2/1997 | Gal et al. | 359/569 |
| 5,610,734 | * 3/1997 | Aharoni et al. | 359/615 |
| 5,701,005 | 12/1997 | Meyers | 359/574 |
| 5,781,257 | 7/1998 | Gal et al. | 349/57 |
| 5,900,630 | * 5/1999 | Tang et al. | 250/338.4 |
| 6,034,372 | * 3/2000 | LeVan | 250/352 |

FOREIGN PATENT DOCUMENTS

| | | |
|---|---|---|
| 1474370 | 5/1977 | (GB) . |
| WO 91/02380 | 2/1991 | (WO) . |
| WO 94/15184 | 7/1994 | (WO) . |

OTHER PUBLICATIONS

Color Separation by use of binary optics; Optics Letters/vol. 18, No. 15/Aug. 1, 1993; 1993 Optical Society of America pp. 1214–1216.

Binary Optics Technology: The Theory and Design of Multi-level Diffractive Optical Elements: Technical Report 854; G.J. Swanson: Aug. 14, 1989; Lincoln Laboratory; Lexington, MA.

\* cited by examiner

Primary Examiner—Cassandra Syprou
Assistant Examiner—John Juba, Jr.
(74) Attorney, Agent, or Firm—Stout, Uxa, Buyan & Mullins, LLP; Donald E. Stout

(57) ABSTRACT

A method and apparatus for multicolor detection employing the natural chromatic aberration of a diffractive microlens to detect two or more colors or light. In the preferred embodiment the diffractive microlens detects two colors in the VLWIR spectral region and is focused on a two-part detector having a central region to detect the shorter bandwidth and a concentrically disposed region to detect the long band, VLWIR radiation. These detectors are arranged in a multicolor focal plane array to allow imaging.

20 Claims, 6 Drawing Sheets

MULTICOLOR DETECTOR AND FOCAL PLANE ARRAY USING DIFFRACTIVE LENSES

BACKGROUND OF THE INVENTION

This invention relates to the use of a microlens array coupled with an associated detector array to effect color separation within each optical pixel of an area array of detection pixel elements (a focal plane array). This invention relates more particularly to a simpler method for simultaneously detecting radiation intensity in each of several wavelength bands when the focal plane array is illuminated with radiation over a broad spectral range. This invention will be particularly useful for multicolor detector arrays operating in the infrared spectral range.

Traditional sensor systems have relied on filters and beam splitters to direct light in different spectral bands to separate one-color focal plane arrays. Multicolor focal plane arrays therefore provide a large reduction in system complexity in such systems by eliminating complex optics and critical alignments.

Multicolor focal plane arrays have been proposed and some have been demonstrated using a variety of techniques. Perhaps the most straightforward approach utilizes stacked detectors with differing spectral responses, each of which cover most of the optical pixel area. This requires a detector material technology that allows tuning of the spectral response. For example, stacked detector solutions to two-color focal plane arrays are being developed with Mercury Cadmium Telluride and with Quantum Well Infrared Photoconductor detectors.

While versatile, stacked detector technologies are limited either in response wavelength and/or performance and are therefore not suited for many applications, particularly because of the added materials complexity involved in the fabrication of stacked detectors.

Special patterned filters are often used to make multicolor focal plane arrays. Multicolor charge-coupled device or active pixel sensor focal plane arrays with deposited filters are commonly used in both video and still cameras. However, patterned filters waste photons by rejecting all out-of-band photons and not allowing those to be detected and high performance systems usually need to utilize every available photon for maximum sensitivity. In addition, for long wavelength infrared applications the materials used to fabricate the filter are difficult to deposit and usually require a very thick filter, limiting the transmission and fill factor of the filter as well as the minimum filter size.

Another approach superimposes a linear diffraction grating onto a refractive microlens for each optical pixel and etches an array of the resulting structures, most often on the backside of the detector substrate. The lens focuses the incident light to a spot much smaller than a pixel while the grating simultaneously diffracts the light off-axis at an angle dependent on the wavelength. Sub-pixel sized detector elements on the front side of the substrate at the focus of the lens and are properly spaced to intercept the diffracted light may then detect the light in two or more spectral bands. For example, the structure resulting from a superposition of a linear diffraction grating onto a refractive microlens is referred as a "dispersive microlens" in the disclosure of Gal, U.S. Pat. No. 5,497,269.

These approaches to multicolor lens detector systems are often used but have many drawbacks. They are more complicated because they require multiple optical devices to implement a multicolor detector. The patterned filters are inefficient while the other approaches pose fabrication and materials difficulties and are therefore expensive as well. Furthermore, these methods are difficult to apply over wide spectral bands and to extend into the very long wavelength infrared (VLWIR) spectral region; for example it is difficult to make a linear diffraction grating effective over more than an octave in wavelength.

SUMMARY OF THE INVENTION

In the present invention a diffractive microlens coupled to a special multiple detector configuration is used to construct a multicolor optical pixel. An optical pixel or pixel as used herein is defined as an optically active area at the focal plane of an optical system. The invention is a method and apparatus for simultaneous multicolor light detection using a circular, symmetrical diffractive microlens in combination with two concentric detectors, one centrally located and the second concentrically disposed around the first. These two detectors are used to discern two spectral colors or bands out of broadband light illuminating the pixel. Color separation is effected by the inherent strong chromatic aberration of the diffractive microlens. The circular, symmetrical diffractive microlens is designed to focus light in a band $\Delta\lambda$ of wavelengths centered about a point $\lambda_0$ onto the central detector. This approach takes fill advantage of the strong focusing that is possible inside the type of high refractive index material that is typically used in a detector substrate so that light can be focused onto a detector much smaller than the optical pixel, in effect the microlens functions as an immersion lens.

In an alternative embodiment of the invention, a plurality of such optical pixels may be assembled to form a multicolor focal plane array.

In yet another embodiment, the present invention is used as a multicolor focal plane array for discrimination of exo-atmospheric targets. The multicolor focal plane array is designed and fabricated for the VLWIR spectral region, where it may be used in the discrimination of exo-atmospheric targets from decoys.

DETAILED DESCRIPTION OF THE INVENTION

Figure 1:
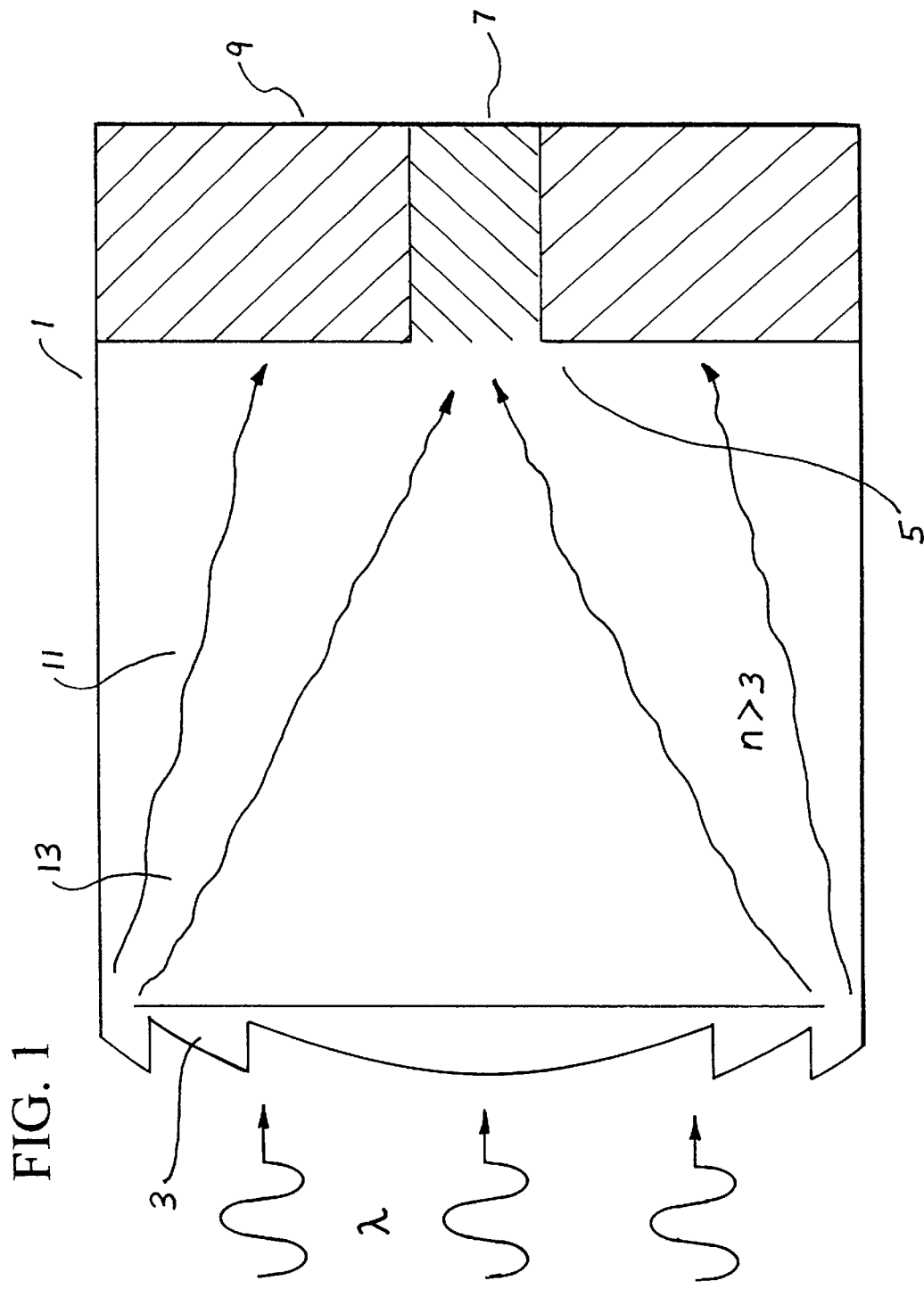
FIG. 1 is a schematic side view of the preferred embodiment of one optical pixel according to the current invention.

The following detailed description, and the figures to which it refers, are provided for the purpose of describing example(s) and specific embodiment(s) of the invention only and are not intended to exhaustively describe all possible examples and embodiments of the invention.

The design and construction of diffractive microlenses is disclosed by Swanson, G. J., in *Technical Report 854, Binary Optical Technology: The Theory and Design of Multi-level Diffractive Optical Elements*, Aug. 14, 1989, Lincoln Laboratory, Massachusetts Institute of Technology, and is expressly incorporated by reference herein.

As described by Swanson, the effect of the surface profile of a lens on the phase of incident light of wavelength $\lambda$ can be described by a phase function $\phi_\lambda(r)$. The phase function of a diffractive lens is equal to the phase function of the corresponding refractive lens modulo $2\pi$, in other words, the phase function of a diffractive lens is discontinuous at transition points where the phase shift induced in light of the design wavelength $\lambda_0$ changes from $2\pi$ to 0 or from 0 to $2\pi$. Because the transition points correspond to a $2\pi$ phase shift only for light of a single wavelength $\lambda_0$, the diffractive lens has strong chromatic aberration, i.e. the focus of light of wavelength $\lambda_0$ will be sharp but will degrade rapidly as the wavelength deviates from $\lambda_0$, except for integer divisions of the light, of the series $\lambda_0/2$, $\lambda_0/3$, $\lambda_0/4$ . . . , which will be well focused as well. Swanson provides a useful method for locating and designing these transition points in diffractive microlenses.

Diffractive microlenses can be fashioned using the multi-level profile approach known as binary optics as described by Swanson to produce a lens of nearly 100% diffraction efficiency (focusing efficiency) for light of a particular wavelength $\lambda_0$. This technique is used to approximate the ideal diffractive microlens profile by substituting instead a set of discrete levels or steps in the diffractive microlens. By properly combining a number of successive etchings, m, with varying etch depths from successive photo-lithographic masks, m masking operations results in $2^m$ levels in the multi-level lens. As noted by Swanson, using this technique requires that only four masking operations are needed for a 16-phase level structure that can achieve 99% diffraction efficiency at the design wavelength $\lambda_0$.

A two-color optical pixel is constructed by disposing a diffractive microlens on one side of a thin substrate of suitably high index of refraction and transparent material. Two detectors are disposed on the other side of the substrate, arranged so that a small cental detector acts as a short band detector and is centered on the optical axis of the lens. A detector of much larger sensitive area surrounds the short band detector and serves as the long band detector. Color band separation is achieved because the short band detector will efficiently detect light in a band of width $\Delta\lambda$ centered about $\lambda_0$, while light of wavelength substantially longer than $\lambda_0$ will not be focused efficiently onto the small detector. Most of the longer wavelength light will be detected in the long band detector because of its much larger area. The width $\Delta\lambda$ of short band optical pixel may be further optimized by adjusting the focal length $f$ of the diffractive microlens and adjusting the thickness of the substrate to match.

Precise spectral response of the detectors also depends on the specific detector size and pixel size used and whether any optically active separation exists between the short band detector and the long band detector. Separate blocking filters may be used to define both the short band cut-on wavelength and the long band cut-off wavelength.

While the descriptions herein pertain to a two-color optical pixel operating in the VLWIR spectral region, those skilled in the art will appreciate that the invention can be extended to other spectral regions and to multiple colors. Further, those skilled in the art will understand that the diffractive microlens may be fabricated by any of several different techniques. In the preferred embodiment, a close approximation to a diffractive microlens is fabricated by the binary optic technique described by Swanson.

Those skilled in the art will also understand that a plurality of the multicolor optical pixels of this invention can, and in most practical cases will be, assembled into a multicolor focal plane array. A multicolor focal plane array of these optical pixels comprises a focal plane array and its architecture is comprised of an array of detector elements disposed on one side of a thin, transparent substrate with a high index of refraction and a corresponding array of diffractive microlenses disposed on the other side of the substrate. Each pixel consists of a small, cental short band detector and a concentric, surrounding long band detector receiving light through a diffractive microlens, and each is connected to separate electronic output circuits. Electronic readout of a multicolor focal plane array may be accomplished with appropriate electronic circuitry, well known in the art.

In the following various figures identical elements and features are given the same reference number, and similar or corresponding elements and features are or may be given the same reference numbers followed by an a, b, c, and so on as appropriate for purposes of describing the various embodiments of the present invention.

Referring now to FIG. 1 there is shown a two-color optical pixel 1, comprised of a diffractive microlens 3 to focus radiation onto a two-color detector 5. The band of wavelengths defined by $\lambda_0 \pm \Delta\lambda/2$ detected by the central detector is called the short band (SB), shown at 7. Light of wavelengths longer than $\lambda_0 + \Delta\lambda/2$ will not be focused very effectively onto the central detector by the diffractive microlens and these wavelengths will fall more preferentially onto, and be detected by, the concentric long band (LB) detector 9, which detects the band of wavelengths from $\lambda_0 + \Delta\lambda/2$ to the cut-off wavelength of the detector. Wavelengths of light shorter than $\lambda_0 - \Delta\lambda/2$ should be blocked, either by an external blocking filter or by integrally incorporating a blocking material in the focal plane array design.

The width of the short pass band $\Delta\lambda$ is determined by the focal length, aperture, and design wavelength of the diffractive microlens as well as by the size of the central detector. Swanson gives an expression for the maximum wavefront error, $\max\phi_e$, of a diffractive microlens (in air) as $$\max\phi_\varepsilon = \frac{D}{8(F/\#)}\left(\frac{\Delta\lambda}{\lambda^2}\right) = \frac{D^2}{8f}\left(\frac{\Delta\lambda}{\lambda^2}\right).$$

Where, D is the lens diameter, F/# is the f-number of the lens, and $f$ is the focal length of the lens. If it is assumed that the bandwidth detected by the central detector is constant for a constant wavefront error, then $$\Delta\lambda \propto \frac{f\lambda^2}{D^2}.$$

The method of the current invention comprises constructing an optical pixel of the invention and detecting a plurality of wavelengths of light with the aforesaid appropriate electronic circuitry.

In the preferred embodiment the two detectors form a 50 $\mu$m×50 $\mu$m square, and the diffractive microlens is a corresponding 50 µm×50 µm square lens. Referring again to FIG. 1 there is schematically shown a ray-trace plot with two ray bundles 11 and 13. Light at the design wavelength $\lambda_o$ is focused on the center detector as indicated by ray bundle 13 while longer wavelength light principally falls on the surrounding detector as indicated by ray bundles 11, and infrared radiation substantially of a wavelength from 6 µm to 25 µm is split into two bands, the shorter band into one of about 6 µm to 10 µm, the longer band into one of about 10 µm to 25 µm.

Figure 2:
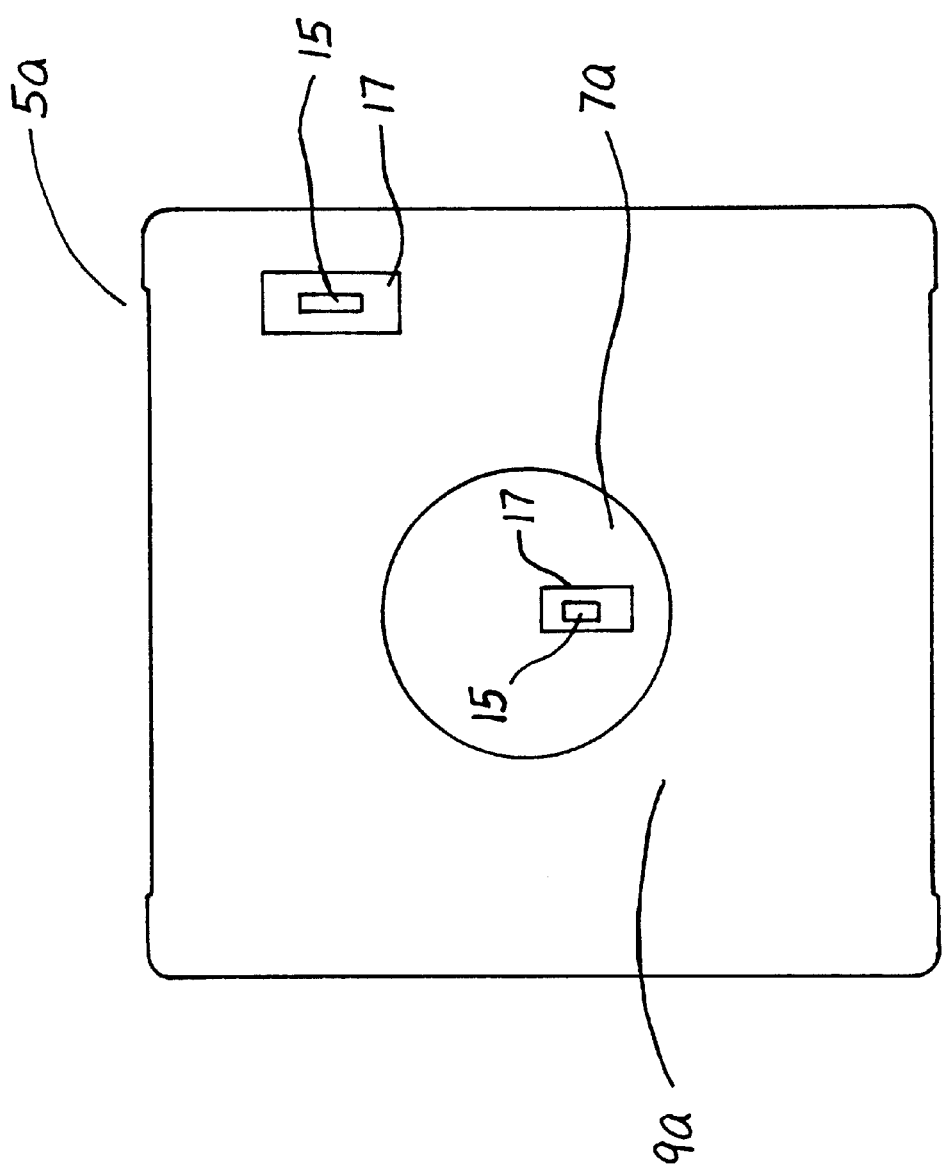
FIG. 2 is a schematic drawing of the two detectors for one optical pixel.

Referring now to FIG. 2 there is shown the detector 5a of the present invention. Detectors made of silicon are preferred over common HgCdTe detectors for this particular embodiment because they display better sensitivity at the longer wavelengths in the VLWIR spectral region. There is shown the central, circular short band detector component 7a, and the concentric, surrounding long band detector 9a, both defined by ion implants into the silicon. The short band detector is centrally located on the optical pixel as a 10 µm diameter circular detector. The long band detector is coextensive with the balance of the 50 µm×50 µm square pixel Indium bumps 15 mounted on metallized areas 17 provide for the connection of each detector to an external electronic readout circuit.

Figure 3:
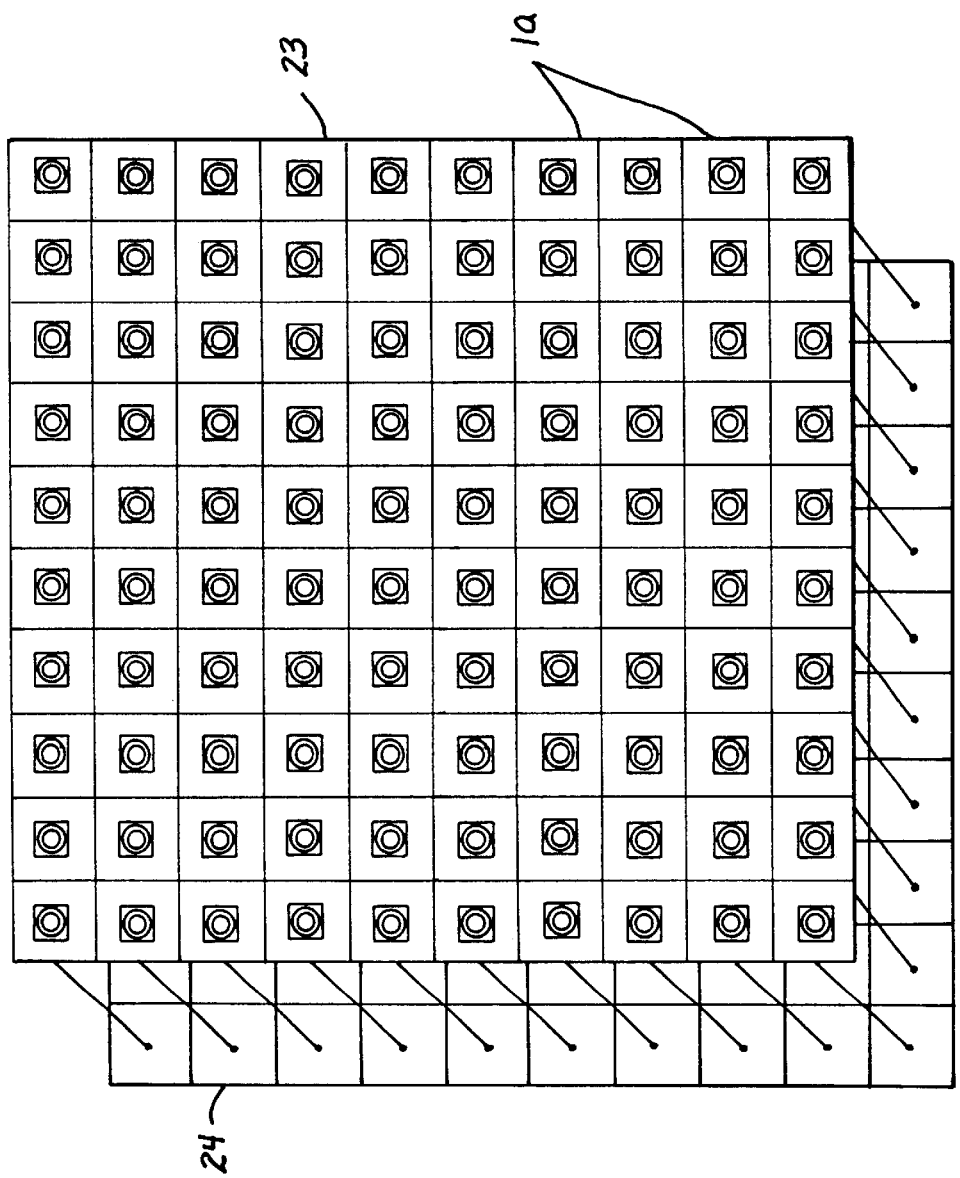
FIG. 3 shows a focal plane array of optical pixels configured in a two-dimensional grid suitable for imaging in two infrared colors, simultaneously.

Referring now to FIG. 3 there is shown a focal plane array 23 comprised of a grid of two-color optical pixels detectors 1a that, in combination with appropriate circuitry 24, well known in the art, form an array that enables a two dimensional image to be formed in the dimensions corresponding to each of the two columns.

The focal plane array 23 may be incorporated into a multicolor focal plane array sensitive to the VLWIR spectral region, where it may be used in the discrimination of exo-atmospheric targets from decoys. Focal plane arrays used for the discrimination of exo-atmospheric targets from decoys are well known in the art and the optical pixel design of the present invention may be used in these systems instead of the multiple focal plane arrays used in other optical pixel configurations of the prior art, resulting in a consequent improved performance and sensitivity as outlined above.

Figure 4:
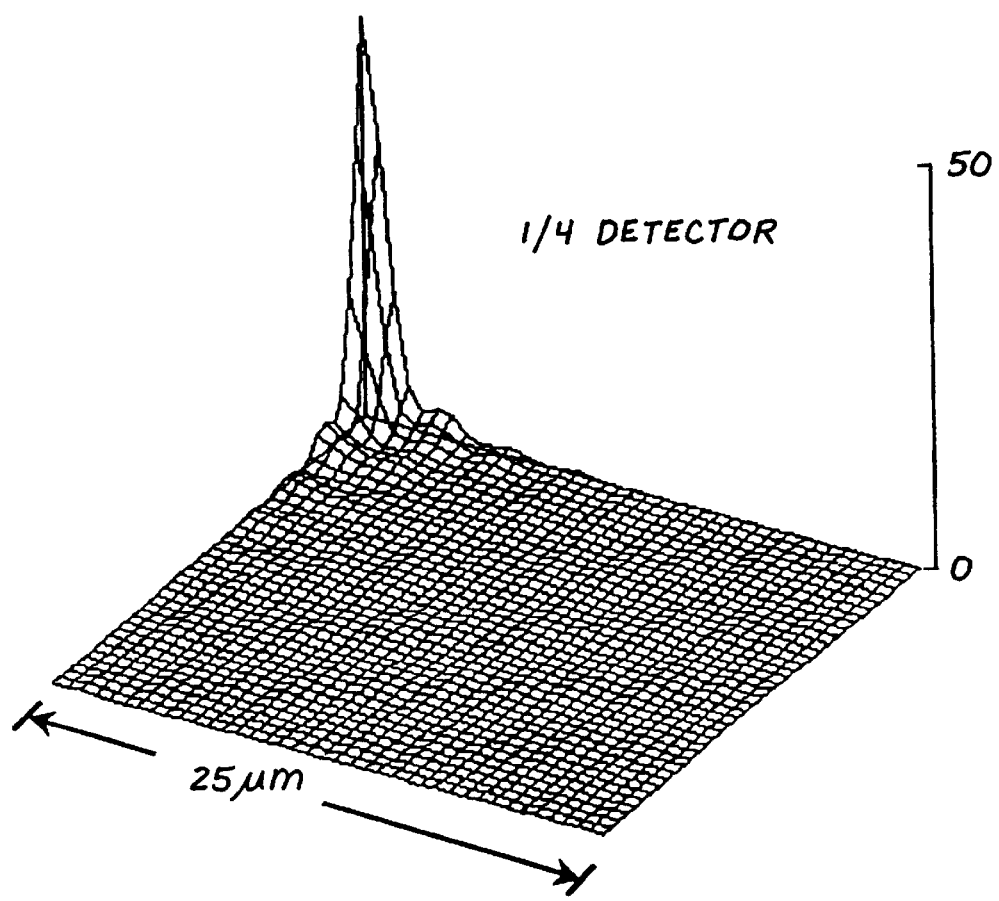
FIG. 4 is a three-axis plot that shows a three-dimensional representation of one quarter of the calculated distribution of $\lambda=8 \,\mu m$ light intensity on the detectors for the particular case of $\lambda_0=8 \,\mu m$, optical pixel size=50 $\mu m \times 50 \,\mu m$ and focal length is 50 $\mu m$; one quarter of the detector area is shown.
Figure 5:
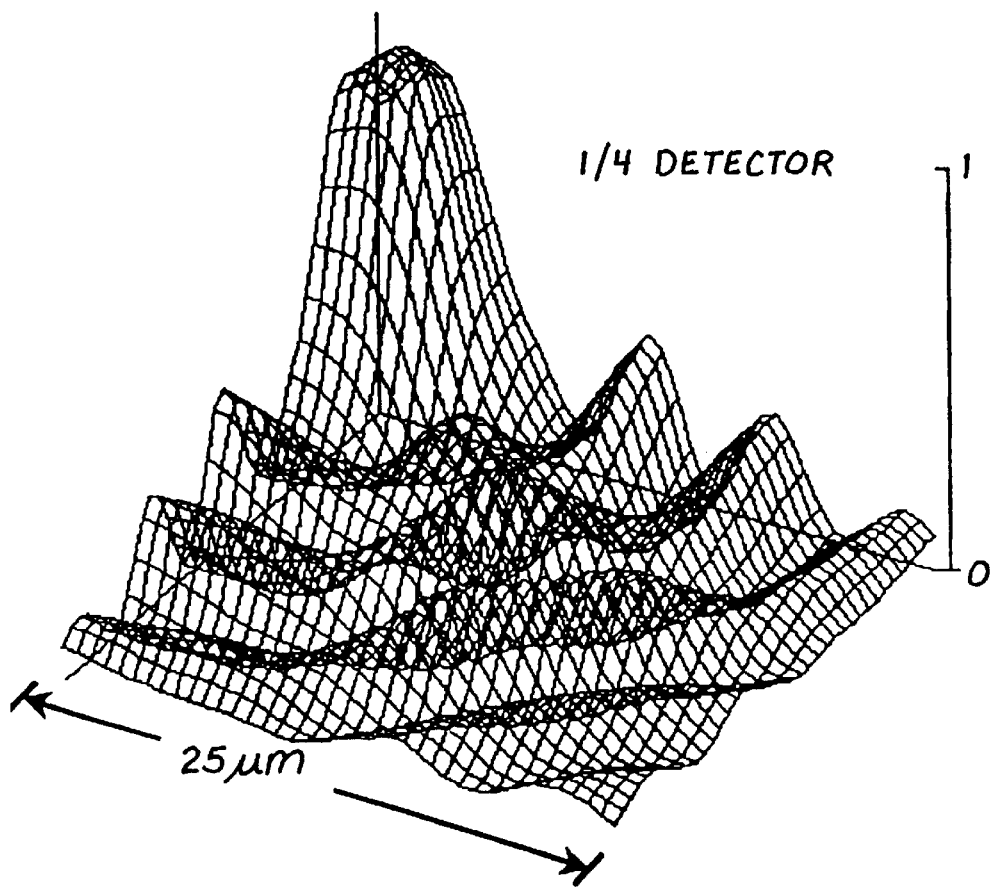
FIG. 5 is a three-axis plot that shows a three-dimensional representation of one quarter of the calculated distribution of $\lambda=12 \,\mu m$ light intensity on the detectors for the optical pixel of FIG. 4; one quarter of the detector area is shown.

Referring now to FIG. 4 there is shown a three-axis graph that shows a three-dimensional representation depicting the calculated light intensity pattern on one quarter of the detector for light of wavelength 8 µm. Referring now to FIG. 5 there is shown a three-axis graph that shows a three-dimensional representation depicting the calculated light intensity pattern on one quarter of the detector for light of wavelength 12 µm. The calculations for both FIG. 4 and FIG. 5 were made for a square 50 µm×50 µm optical pixel which has a diffractive microlens optimized to focus at $\lambda_o$=8 µm light at a focal length of 50 µm in silicon (which has a refractive index of n=3.4). The light of 8 µm wavelength is sharply focused in the middle of the pixel (where the central detector is located) with a relative peak intensity of about 50 on the short band detector.

Referring now to FIG. 5, light of 12 µm wavelength has a relative peak intensity of only about 1 in the region of the central pixel, and most of the 12 µm or longer wavelength light falls onto the surrounding long band detector, which is generally much larger in surface area than the short band detector.

Figure 6:
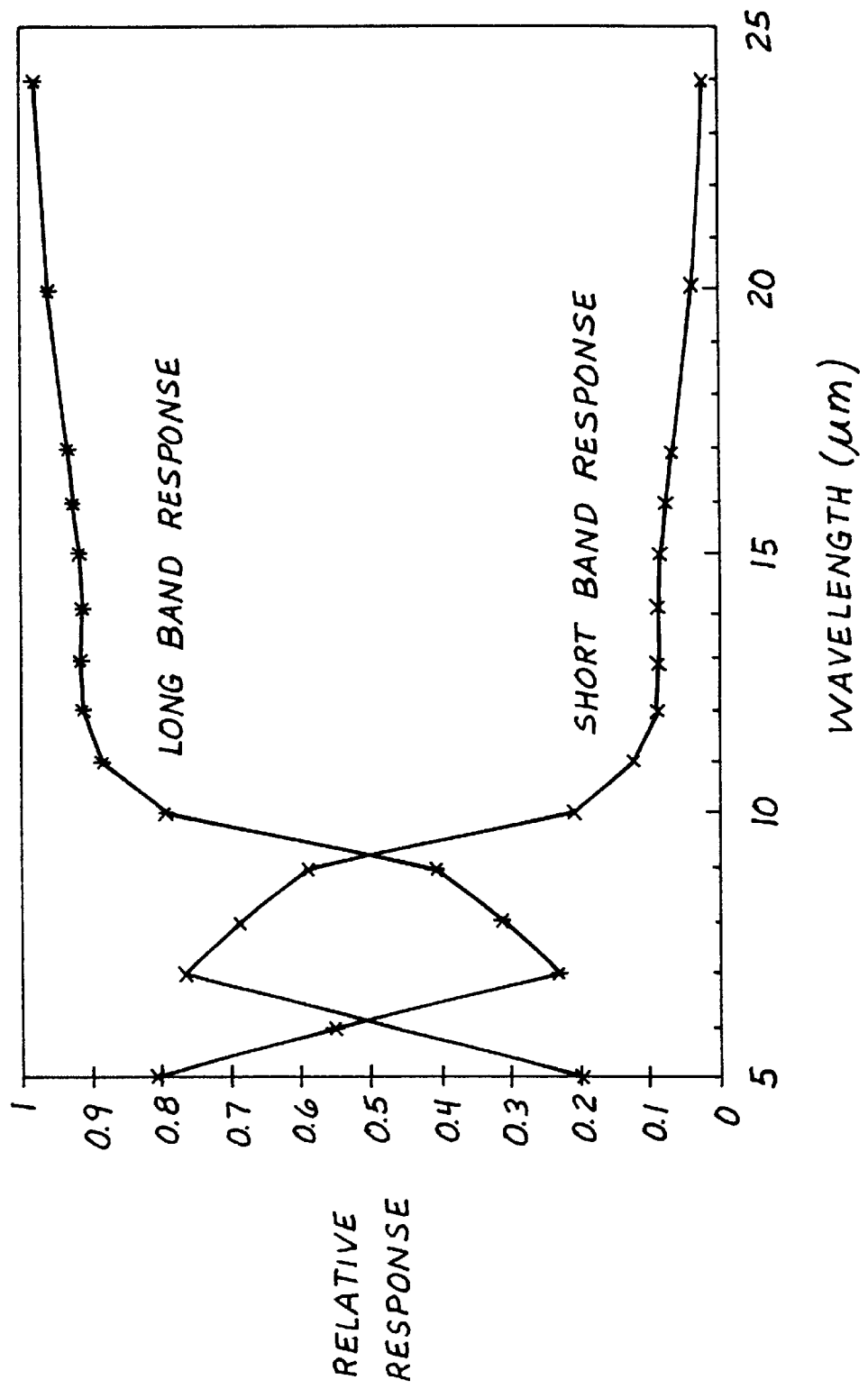
FIG. 6 is a two dimensional graph that shows the calculated relative response curves for the short band and the long band detectors as a function of illumination wavelength for the optical pixel of FIG. 4.

Calculations of the type shown in FIGS. 4 and 5 were made as a function of wavelength to graph the resulting light intensity shown in FIG. 6. Light intensity was integrated over a 5 µm×5 µm square central detector to generate the short band curve in FIG. 6. The long band curve in FIG. 6 is generated by subtracting the short band integral from 1. Good spectral separation is shown with this calculation.

It will be appreciated that the invention has been described hereabove with reference to certain examples or preferred embodiments as shown in the drawings. Various additions, deletions, changes and alterations may be made to the above-described embodiments and examples without departing from the intended spirit and scope of this invention. Accordingly, it is intended that all such additions, deletions, changes and alterations be included within the scope of the following claims.

What is claimed is:

1. A diffractive lens multicolor detector, comprising:
   a substantially planar optical pixel having a plurality of concentrically disposed detector areas, and a symmetrical diffractive lens that causes chromatic aberration, wherein said lens is configured to focus light across the optical pixel such that substantially different spectral regions of light fall on different detector areas.

2. The diffractive lens multicolor detector of claim 1, wherein the plurality of detector areas are comprised of a central shortband wavelength detector area and a concentric longband wavelength detector area, and
   the diffractive lens focuses light to cause shorter wavelengths to fall on the shortband detector area and longer wavelengths to fall on the longband detector area.

3. The diffractive lens multicolor detector of claim 2 wherein the lens is a microlens.

4. The diffractive lens multicolor detector of claim 3 wherein the optical pixel is approximately 50 µm² in area.

5. The diffractive lens multicolor detector of claim 3 wherein the detector areas are made substantially of HgCdTe.

6. The diffractive lens multicolor detector of claim 3 wherein the detector areas are made substantially of silicon.

7. The diffractive lens multicolor detector of claim 2 wherein at least one of the detector areas is sensitive to light in the VLWIR spectral region.

8. A diffractive lens multicolor detector focal plane array, comprising:
   a plurality of diffractive lens multicolor detectors configured in a two-dimensional grid pattern, wherein each diffractive lens multicolor detector includes a substantially planar optical pixel having a plurality of concentrically disposed detector areas and a symmetrical diffractive lens that causes chromatic aberration, wherein said lens is configured to focus light across the optical pixel so that substantially different spectral regions of light fall on different detector areas.

9. The diffractive lens multicolor detector focal plane array of claim 8, wherein the plurality of detector areas of a majority of the optical pixels are comprised of a central shortband wavelength detector area and a concentric longband wavelength detector area, and the diffractive lens of each of these optical pixels focuses light to cause shorter wavelengths to fall on the shortband detector area and longer wavelengths of that light to fall on the longband detector area.

10. The diffractive lens multicolor detector focal plane array of claim 9 wherein the diffractive lens is a microlens.

11. The diffractive lens multicolor detector focal plane array of claim 10 wherein the optical pixels have at least one detector area that is sensitive to light in the VLWIR spectral region.

12. The diffractive lens multicolor detector focal plane array of claim 11 wherein the focal plane array is connected to appropriate electronic circuitry for detecting exo-atmospheric targets.

13. The diffractive lens multicolor detector focal plane array of claim 10 wherein each optical pixel including a microlens is approximately 5 $\mu$m$^2$ in area.

14. The diffractive lens multicolor detector focal plane array of claim 10 wherein the detector areas of the optical pixels having central shortband and concentric longband detector areas are substantially made of HgCdTe.

15. The diffractive lens multicolor detector focal plane array of claim 10 wherein the detector areas of the optical pixels having central shortband and concentric longband detector areas are substantially made of silicon.

16. A method for detecting multiple colors using a diffractive lens, comprising the steps of
   a. providing a substantially symmetrical diffractive lens causing chromatic aberration,
   b. focusing light with said diffractive lens across a substantially planar optical pixel having a plurality of concentric detector areas, thereby causing different discrete spectral regions to fall substantially exclusively on different detector areas, and
   c. detecting said discrete spectral regions with appropriate electronic circuitry connected to said detector areas.

17. The method of claim 16, wherein the detector areas of the optical pixel include a central shortband wavelength detector area and a concentric longband wavelength detector area, and the diffractive lens focuses light to cause shorter wavelengths to fall on the shortband detector area and longer wavelengths to fall on the longband detector area.

18. The method of claim 17 wherein there are a plurality of optical pixels configured in a two-dimensional grid to form a multicolor focal plane array.

19. The method of claim 18 wherein the multicolor focal plane array is connected to appropriate electronic circuitry for detecting exo-atmospheric targets.

20. The method of claim 17 wherein at least one of the shortband and longband detector areas is sensitive to the VLWIR spectral region.

* * * * *

UNITED STATES PATENT AND TRADEMARK OFFICE
CERTIFICATE OF CORRECTION

PATENT NO.    : 6,236,508 B1  
DATED         : May 22, 2001  
INVENTOR(S)   : Stapelbroek Page 1 of 1

It is certified that error appears in the above-identified patent and that said Letters Patent is hereby corrected as shown below:

<u>Column 7,</u>
Line 5, change "5" to -- 50 --.

Signed and Sealed this

Fourteenth Day of May, 2002

Attest:

Attesting Officer

JAMES E. ROGAN
*Director of the United States Patent and Trademark Office*